(12) United States Patent
Suzuki et al.

(10) Patent No.: US 10,845,691 B2
(45) Date of Patent: Nov. 24, 2020

(54) LIGHT SOURCE DEVICE AND PROJECTOR

(71) Applicant: SEIKO EPSON CORPORATION, Tokyo (JP)

(72) Inventors: Junichi Suzuki, Matsumoto (JP); Hidefumi Sakata, Kamiina-gun (JP); Shingo Komiyama, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/700,657

(22) Filed: Dec. 2, 2019

(65) Prior Publication Data

US 2020/0174352 A1 Jun. 4, 2020

(30) Foreign Application Priority Data

Dec. 3, 2018 (JP) ................. 2018-226747

(51) Int. Cl.
*G03B 21/20* (2006.01)
*F21V 8/00* (2006.01)
*F21V 7/26* (2018.01)

(52) U.S. Cl.
CPC .............. *G03B 21/204* (2013.01); *F21V 7/26* (2018.02); *G02B 6/0006* (2013.01); *G02B 6/0008* (2013.01); *G03B 21/208* (2013.01); *G03B 21/2066* (2013.01)

(58) Field of Classification Search
CPC ........ F21V 7/26; G02B 6/0075; G03B 21/204
See application file for complete search history.

(56) References Cited

U.S. PATENT DOCUMENTS

| | | | |
|---|---|---|---|
| 2006/0227570 A1* | 10/2006 | Rutherford | H04N 9/315 362/612 |
| 2008/0079910 A1* | 4/2008 | Rutherford | G02B 6/0003 353/84 |
| 2009/0196046 A1* | 8/2009 | Rutherford | G02B 6/0003 362/296.02 |
| 2016/0266297 A1* | 9/2016 | Hikmet | G02B 6/0075 |
| 2017/0139113 A1* | 5/2017 | Peeters | F21S 41/147 |
| 2017/0315433 A1 | 11/2017 | Ronda et al. | |
| 2018/0363858 A1* | 12/2018 | Peeters | G02B 6/00 |

FOREIGN PATENT DOCUMENTS

JP 2017-536664 A 12/2017

* cited by examiner

*Primary Examiner* — Alexander K Garlen
(74) *Attorney, Agent, or Firm* — Oliff PLC

(57) ABSTRACT

A light source device includes a light source section configured to emit first light, a light guide body configured to propagate a part of the first light, a wavelength conversion section including a phosphor which is excited by another part of the first light and transmitted though the light guide body, and emits second light, and a light combining section configured to combine the part of the first and second lights together. The light guide body includes a first and a second side surface opposed to each other, and the wavelength conversion section includes a third and a fourth side surface opposed to each other. The light source section is disposed at a position opposed to the first side surface, and the light guide body and wavelength conversion section are disposed in parallel to each other so that the second and third side surfaces are opposed to each other.

12 Claims, 8 Drawing Sheets

LIGHT SOURCE DEVICE AND PROJECTOR

The present application is based on, and claims priority from JP Application Serial Number 2018-226747, filed Dec. 3, 2018, the disclosure of which is hereby incorporated by reference herein in its entirety.

BACKGROUND

1. Technical Field

The present disclosure relates to a light source device and a projector.

2. Related Art

As a light source device used for a projector, there is proposed a light source device using fluorescence emitted from a phosphor when irradiating the phosphor with excitation light emitted from a light emitting element. In JP-T-2017-536664 (Document 1; the term "JP-T" as used herein means a published Japanese translation of a PCT patent application), there is disclosed an illumination device provided with a ceramic body shaped like a rod having a wavelength conversion function, and a light emitting diode (LED) for emitting excitation light, and having a configuration of making the excitation light enter the ceramic body from a side surface, and taking out the converted light from an end surface of the ceramic body.

As described in Document 1, by making the light emitted from the LED enter the wavelength conversion member, it is possible to obtain light different in wavelength from the light emitted from the LED. For example, when the wavelength conversion member includes a yellow phosphor, it is possible to obtain yellow light from blue light emitted from the LED. However, in order to obtain white light necessary for a light source device for a projector, it is necessary to separately provide a light source for emitting the blue light, and an optical system such as a light combining element for combining the blue light and the yellow light with each other in addition to the illumination device of Document 1. As a result, there is a problem that the light source device grows in size. Further, also when obtaining colored light of a color other than white, the optical system for combining the fluorescence and other colored light with each other is necessary, and thus, there is a problem that the light source device grows in size.

SUMMARY

A light source device according to an aspect of the present disclosure includes a light source section configured to emit first light, a light guide body configured to propagate a part of the first light emitted from the light source section, a wavelength conversion section including a phosphor which is excited by another part of the first light emitted from the light source section and transmitted though the light guide body, and emits second light, and a light combining section configured to combine a part of the first light emitted from the light guide body and the second light emitted from the wavelength conversion section with each other. The light guide body has a first side surface and a second side surface opposed to each other, and a first end surface and a second end surface opposed to each other, the wavelength conversion section has a third side surface and a fourth side surface opposed to each other, and a third end surface and a fourth end surface opposed to each other, the light source section is disposed at a position opposed to the first side surface, and the light guide body and the wavelength conversion section are disposed in parallel to each other so that the second side surface and the third side surface are opposed to each other.

In the light source device according to the aspect of the present disclosure, the light guide body and the wavelength conversion section may be disposed adjacent to each other so that a longitudinal direction of the light guide body and a longitudinal direction of the wavelength conversion section are parallel to each other.

In the light source device according to the aspect of the present disclosure, there may be adopted a configuration in which the first light is blue light, and the second light is yellow light, and the light combining section combines a part of the first light and the second light with each other to thereby emit white light.

The light source device according to the aspect of the present disclosure may further include a light transmissive member disposed between the light source section and the first side surface.

In the light source device according to the aspect of the present disclosure, a refractive index of the light transmissive member and a refractive index of the light guide body may be equal to each other.

The light source device according to the aspect of the present disclosure may further include an excitation light source section disposed so as to be opposed to the fourth side surface, and configured to emit excitation light toward the wavelength conversion section.

In the light source device according to the aspect of the present disclosure, the light source section may include a light emitting diode light source.

In the light source device according to the aspect of the present disclosure, the light source section may include a plurality of light emitting diode light sources, and the plurality of light emitting diode light sources may be arranged at intervals.

In the light source device according to the aspect of the present disclosure, the light guide body may include a reflecting film disposed in an area between the light emitting diode light sources adjacent to each other on the first side surface.

In the light source device according to the aspect of the present disclosure, the light combining section may be disposed at a position opposed to the second end surface and the fourth end surface.

In the light source device according to the aspect of the present disclosure, the light combining section may include a prism opposed to the second end surface, and a dichroic prism opposed to the fourth end surface.

A projector according to another aspect of the present disclosure includes the light source device according to any one of the above aspects of the present disclosure, a light modulation device configured to modulate light from the light source device in accordance with image information, and a projection optical device configured to project the light modulated by the light modulation device.

DESCRIPTION OF EXEMPLARY EMBODIMENTS

First Embodiment

Hereinafter, a first embodiment of the present disclosure will be described using FIG. 1 through FIG. 3.

A projector according to the present embodiment is an example of a liquid crystal projector using liquid crystal panels as light modulation devices.

It should be noted that in each of the drawings described below, the constituents are shown with the scale ratios of respective sizes set differently between the constituents in some cases in order to facilitate the visualization of each of the constituents.

Figure 1:
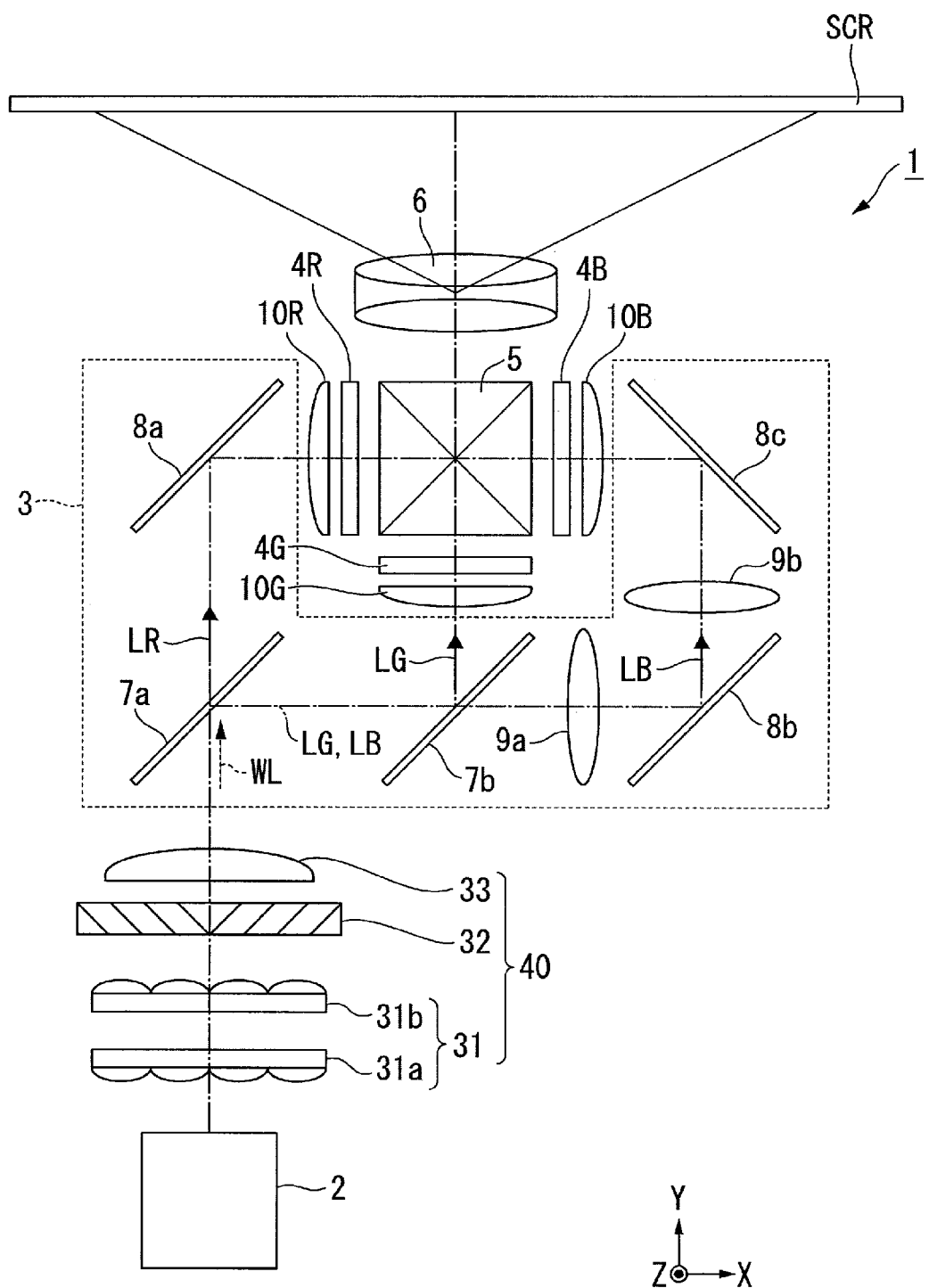
FIG. 1 is a schematic configuration diagram of a projector according to a first embodiment.

FIG. 1 is a schematic configuration diagram of a projector 1 according to the first embodiment.

The projector 1 according to the first embodiment is a projection-type image display device for projecting a color image on a screen (a projection target surface) SCR. The projector 1 uses three light modulation devices corresponding to respective colored light, namely red light LR, green light LG, and blue light LB.

As shown in FIG. 1, the projector 1 is provided with a light source device 2, a homogenous illumination optical system 40, a color separation optical system 3, a light modulation device 4R, a light modulation device 4G, a light modulation device 4B, a combining optical system 5, and a projection optical device 6.

The light source device 2 emits illumination light WL toward the homogenous illumination optical system 40. The detailed configuration of the light source device 2 will be described later in detail.

The homogenous illumination optical system 40 is provided with an integrator optical system 31, a polarization conversion element 32, and a superimposing optical system 33. The integrator optical system 31 is provided with a first lens array 31a and a second lens array 31b. The homogenous illumination optical system 40 homogenizes the intensity distribution of the illumination light WL emitted from the light source device 2 in each of the light modulation device 4R, the light modulation device 4G, and the light modulation device 4B as illumination target areas. The illumination light WL having been emitted from the homogenous illumination optical system 40 enters the color separation optical system 3.

The color separation optical system 3 separates the illumination light WL as white light into the red light LR, the green light LG, and the blue light LB. The color separation optical system 3 is provided with a first dichroic mirror 7a, a second dichroic mirror 7b, a first reflecting mirror 8a, a second reflecting mirror 8b, a third reflecting mirror 8c, a first relay lens 9a, and a second relay lens 9b.

The first dichroic mirror 7a separates the illumination light WL from the light source device 2 into the red light LR and the other light (the green light LG and the blue light LB).

The first dichroic mirror 7a transmits the red light LR thus separated from, and at the same time reflects the other light (the green light LG and the blue light LB). Meanwhile, the second dichroic mirror 7b separates the other light into the green light LG and the blue light LB. The second dichroic mirror 7b reflects the green light LG thus separated from and transmits the blue light LB.

The first reflecting mirror 8a is disposed in the light path of the red light LR, and the red light LR which has been transmitted through the first dichroic mirror 7a is reflected by the first reflecting mirror 8a toward the light modulation device 4R. Meanwhile, the second reflecting mirror 8b and the third reflecting mirror 8c are disposed in the light path of the blue light LB, and the blue light LB which has been transmitted through the second dichroic mirror 7b is reflected by the second reflecting mirror 8b and the third reflecting mirror 8c toward the light modulation device 4B. Further, the green light LG is reflected by the second dichroic mirror 7b toward the light modulation device 4G.

The first relay lens 9a and the second relay lens 9b are disposed on the light exit side of the second dichroic mirror 7b in the light path of the blue light LB. The first relay lens 9a and the second relay lens 9b correct a difference in illuminance distribution of the blue light LB due to the fact that the blue light LB is longer in optical path length than the red light LR and the green light LG.

The light modulation device 4R modulates the red light LR in accordance with image information to form image light corresponding to the red light LR. The light modulation device 4G modulates the green light LG in accordance with the image information to form image light corresponding to the green light LG. The light modulation device 4B modulates the blue light LB in accordance with the image information to form image light corresponding to the blue light LB.

As the light modulation device 4R, the light modulation device 4G, and the light modulation device 4B, there are used, for example, transmissive liquid crystal panels. Further, on the incident side and the exit side of the liquid crystal panel, there are disposed polarization plates (not shown), respectively, and thus, there is formed a configuration of transmitting only the linearly polarized light with a specific direction.

On the incident side of the light modulation device 4R, the light modulation device 4G, and the light modulation device 4B, there are disposed a field lens 10R, a field lens 10G, and a field lens 10B, respectively. The field lens 10R, the field lens 10G, and the field lens 10B collimate principal rays of the red light LR, the green light LG, and the blue light LB entering the light modulation device 4R, the light modulation device 4G, and the light modulation device 4B, respectively.

The combining optical system 5 combines the image light corresponding to the red light LR, the image light corresponding to the green light LG, and the image light corresponding to the blue light LB with each other in response to incidence of the image light respectively emitted from the light modulation device 4R, the light modulation device 4G, and the light modulation device 4B, and then emits the image light thus combined toward the projection optical device 6. As the combining optical system 5, there is used, for example, a cross dichroic prism.

The projection optical device 6 is constituted by a plurality of projection lenses. The projection optical device 6 projects the image light having been combined by the combining optical system 5 toward the screen SCR in an enlarged manner. Thus, an image is displayed on the screen SCR.

The light source device 2 will hereinafter be described.

Figure 2:
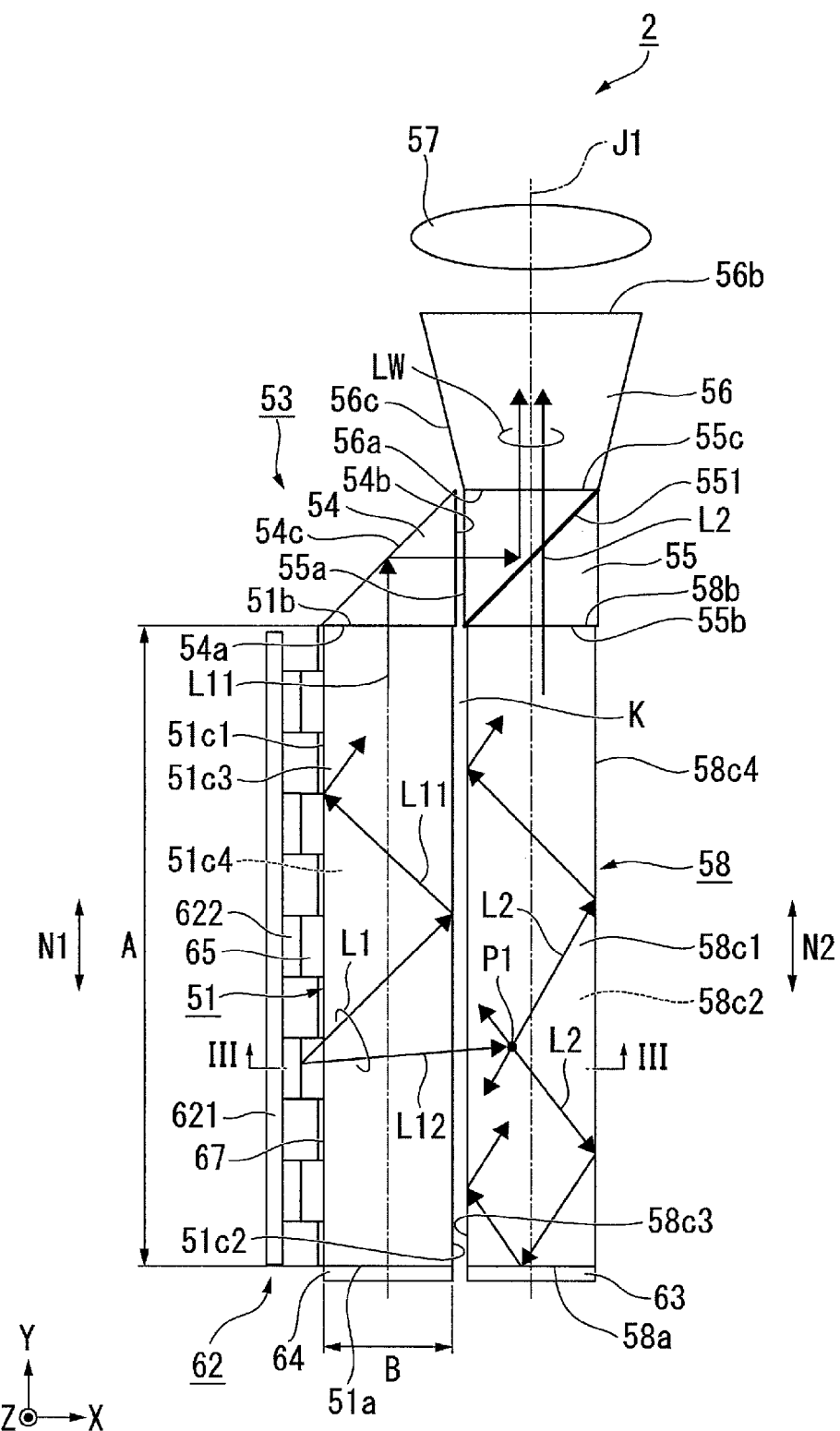
FIG. 2 is a plan view of a light source device according to the first embodiment.

FIG. 2 is a plan view showing a schematic configuration of the light source device 2. FIG. 3 is a cross-sectional view along the line III-III shown in FIG. 2.

As shown in FIG. 2, the light source device 2 is provided with a light guide rod 51 (a light guide body), a wavelength conversion rod 58 (a wavelength conversion section), a light source section 62, light transmissive members 65, a light combining section 53, an angle conversion element 56, and a collimator lens 57.

The light guide rod 51 has a quadrangular prismatic shape having six faces. The six faces include a first end surface 51a and a second end surface 51b opposed to each other, and four side surfaces 51c1, 51c2, 51c3, and 51c4 crossing the first end surface 51a and the second end surface 51b. In the present specification, the direction in which the first end surface 51a and the second end surface 51b are opposed to each other is defined as a longitudinal direction N1 of the light guide rod 51. In the following description, out of the four side surfaces 51c1, 51c2, 51c3, and 51c4, the side surface opposed to the light source section 62 is referred to as a first side surface 51c1, and the side surface opposed to the wavelength conversion rod 58 is referred to as a second side surface 51c2.

Similarly, the wavelength conversion rod 58 has a quadrangular prismatic shape having six faces. The six faces include a third end surface 58a and a fourth end surface 58b opposed to each other, and four side surfaces 58c1, 58c2, 58c3, and 58c4 crossing the third end surface 58a and the fourth end surface 58b. An axis passing through the center of the third end surface 58a and the center of the fourth end surface 58b of the wavelength conversion rod 58 is defined as an optical axis J1 of the light source device 2. The light from the light source device 2 is emitted in a direction of the optical axis J1. In the present specification, the direction in which the third end surface 58a and the fourth end surface 58b are opposed to each other is defined as a longitudinal direction N2 of the wavelength conversion rod 58. In the following description, out of the four side surfaces 58c1, 58c2, 58c3, and 58c4, the side surface opposed to the light guide rod 51 is referred to as a third side surface 58c3, and the side surface opposed to the third side surface 58c3 is referred to as a fourth side surface 58c4.

In the present embodiment, the light guide rod 51 and the wavelength conversion rod 58 have substantially the same dimensions. The dimension A in the longitudinal direction N1 of the light guide rod 51 is longer than the dimension B in the short-side direction (a direction perpendicular to the longitudinal direction N1) of the light guide rod 51. For example, the dimension A is substantially ten through several tens times as large as the dimension B. The same as the light guide rod 51 applies to the wavelength conversion rod 58.

The light guide rod 51 and the wavelength conversion rod 58 are disposed in parallel to each other at a distance so that the second side surface 51c2 of the light guide rod 51 and the third side surface 58c3 of the wavelength conversion rod 58 are opposed to each other. In a space between the light guide rod 51 and the wavelength conversion rod 58, there exists air K. The space between the light guide rod 51 and the wavelength conversion rod 58 can be filled with a low refractive index material lower in refractive index than the light guide rod 51, but it is preferable for the air K to exist in the space therebetween.

In the case of the present embodiment, the light guide rod 51 and the wavelength conversion rod 58 are disposed side by side so that the longitudinal direction N1 of the light guide rod 51 and the longitudinal direction N2 of the wavelength conversion rod 58 become parallel to each other. Due to this arrangement, it is possible to decrease the width (the dimension in a direction perpendicular to the optical axis J1) of the light source device 2. It should be noted that the longitudinal direction N1 of the light guide rod 51 and the longitudinal direction N2 of the wavelength conversion rod 58 are not necessarily required to be parallel to each other, but can also be tilted from the parallel state.

In the following description, out of the two end surfaces of the light guide rod 51, the end surface of the light guide rod 51 located on the far side from the light combining section 53 is referred to as a first end surface 51a, and the end surface on the side which is opposed to the first end surface 51a, and on which the light is emitted from the light guide rod 51 is referred to as a second end surface 51b. Further, out of the two end surfaces of the wavelength conversion rod 58, the end surface of the wavelength conversion rod 58 located on the same side as the first end surface 51a of the light guide rod 51 is referred to as a third end surface 58a of the wavelength conversion rod 58, and the end surface on the side which is opposed to the third end surface 58a, and on which the light is emitted from the wavelength conversion rod 58 is referred to as a fourth end surface 58b.

The light source section 62 is provided with a substrate 621, and a plurality of light emitting diode light sources 622 (LED light sources) for emitting first light L1. The plurality of LED light sources 622 is mounted on one surface of the substrate 621 opposed to the first side surface 51c1 of the light guide rod 51. In the present embodiment, the light source section 62 is provided with the five LED light sources 622, but the number of the LED light sources 622 is not particularly limited. The plurality of LED light sources 622 is arranged at intervals in the longitudinal direction N1 of the light guide rod 51.

The wavelength band of the first light L1 to be emitted from the LED light sources 622 is a blue wavelength band of, for example, 400 nm through 480 nm, and the peak wavelength is, for example, 445 nm. Therefore, the first light L1 is the blue light. In such a manner, the light source section 62 emits the first light L1 as the blue light toward the first side surface 51c1 of the light guide rod 51.

The light guide rod 51 is formed of a light transmissive material such as glass. The first light L1 emitted from the light source section 62 enters the light guide rod 51, and the light guide rod 51 propagates partial light L11 inside out of the first light L1 having entered the light guide rod Si. Further, other partial light L12 out of the first light L1 functions as excitation light for the phosphor included in the wavelength conversion rod 58. Therefore, as the wavelength band of the first light L1, there is selected the wavelength band which can function as the excitation light for the phosphor used for the wavelength conversion rod 58.

Further, the light guide rod 51 has reflecting films 67 disposed in areas between the LED light sources 622 adjacent to each other in the first side surface 51c1. In the case of the present embodiment, the reflecting film 67 is disposed not only in the areas between the LED light sources 622 adjacent to each other, but also in all of the areas to which the LED light sources 622 are not opposed in the first side surface 51c1. The reflecting films 67 are each formed of a dielectric multilayer film formed on a surface of the light transmissive material constituting the light guide rod 51.

Further, the reflecting film 67 can also be disposed on other side surfaces 51c3, 51c4 except the first side surface 51c1 and the second side surface 51c2.

The light guide rod 51 has a mirror 64 disposed on the first end surface 51a of the light guide rod 51. The mirror 64 is formed of a metal film or a dielectric multilayer film.

The light transmissive members 65 are disposed between the light source section 62 and the light guide rod 51. In more detail, the light transmissive members 65 are each disposed between the LED light source 622 of the light source section 62 and the first side surface 51c1 of the light guide rod 51 so as to cover a light exit surface of the LED light source 622. The light transmissive members 65 are each formed of, for example, transmissive resin such as silicone resin, or glass frit. It is preferable for the light transmissive members 65 to have a heat resistance property together with a light transmissive property. Further, the light transmissive members 65 also function as bonding members for fixing the light source section 62 and the light guide rod 51 to each other.

Further, it is desirable for the refractive index of the light transmissive members 65 to be equal to the refractive index of the light guide rod 51. According to this configuration, the first light L1 enters the light guide rod 51 at a predetermined angle without causing unwanted refraction when the first light L1 enters the light guide rod 51 from the light transmissive member 65. Thus, it is possible to improve the use efficiency of the first light L1. It should be noted that the expression that "a refractive index of the light transmissive member and a refractive index of the light guide body are equal to each other" in the appended claims is a concept including when the light transmissive member and the light guide body have such a refractive index difference as to cause slight refraction in a level in which the deterioration in the light use efficiency does not affect the performance.

The wavelength conversion rod 58 includes a phosphor which is excited by the other partial light L12 out of the first light L1 having been emitted from the light source section 62 and then passed through the light guide rod 51, and then emits second light L2. In the present embodiment, the wavelength conversion rod 58 is formed of a ceramic phosphor (a polycrystalline phosphor) as the phosphor. The wavelength band of the second light L2 is a yellow wavelength band of, for example, 490 through 750 nm. Therefore, the second light L2 is yellow fluorescence. The wavelength conversion rod 58 can also be formed of a single-crystal phosphor instead of the polycrystalline phosphor. Alternatively, the wavelength conversion rod 58 can also be formed of fluorescent glass. Alternatively, the wavelength conversion rod 58 can also be formed of a material obtained by dispersing a number of phosphor particles in a binder made of glass or resin.

Specifically, the wavelength conversion rod 58 is formed of, for example, an yttrium aluminum garnet (YAG) phosphor. Citing YAG:Ce including cerium (Ce) as an activator agent as an example, as the material of the wavelength conversion rod 58, there can be used a material obtained by mixing raw powder including constituent elements such as $Y_2O_3$, $Al_2O_3$ and $CeO_3$ to cause the solid-phase reaction, Y—Al—O amorphous particles obtained by a wet process such as a coprecipitation process or a sol-gel process, and YAG particles obtained by a gas-phase process such as a spray drying process, a flame heat decomposition process or a thermal plasma process.

The wavelength conversion rod 58 has a mirror 63 disposed on the third end surface 58a of the wavelength conversion rod 58. The mirror 63 is formed of a metal film or a dielectric multilayer film.

The light combining section 53 is disposed at a position opposed to the second end surface 51b of the light guide rod 51 and the fourth end surface 58b of the wavelength conversion rod 58. The light combining section 53 combines the partial light L11 out of the first light L1 having been emitted from the light guide rod 51 and the second light L2 having been emitted from the wavelength conversion rod 58 with each other. The light combining section 53 has a prism 54 opposed to the second end surface 51b of the light guide rod 51, and a dichroic prism 55 opposed to the fourth end surface 58b of the wavelength conversion rod 58.

The prism 54 is disposed so as to have contact with the second end surface 51b of the light guide rod 51. The prism 54 is formed of a prism shaped like a triangular prism having an isosceles right triangular cross-sectional shape, and has a light incidence end surface 54a, a reflecting surface 54c, and a light exit end surface 54b. The prism 54 has a function of folding the light path of the light L11 having entered the prism 54 at an angle of 90° and then emitting the light L11. In other words, the prism 54 reflects the light L11 which has been emitted from the second end surface 51b of the light guide rod 51, with the reflecting surface 54c to thereby fold the light path, and then emits the light L11 from the light exit end surface 54b.

The dichroic prism 55 is disposed so as to be opposed to the fourth end surface 58b of the wavelength conversion rod 58 and the light exit end surface 54b of the prism 54. The dichroic prism. 55 has a configuration having a dichroic mirror 551 disposed inside the prism main body. The dichroic prism 55 has a cubic shape, and has a light incidence end surface 55a, a light incidence end surface 55b, and a light exit end surface 55c. The dichroic mirror 551 has a property of reflecting light in the blue wavelength band while transmitting light in the yellow wavelength band. Therefore, the light L11 having been emitted from the prism 54 is reflected by the dichroic mirror 551 and proceeds toward the light exit end surface 55c. On the other hand, the second light L2 having been emitted from the fourth end surface 58b of the wavelength conversion rod 58 is transmitted through the dichroic mirror 551 and then proceeds toward the light exit end surface 55c.

In such a manner, the dichroic prism 55 combines the light L11 as the blue light having been emitted from the second end surface 51b of the light guide rod 51 and the second light L2 as the yellow light having been emitted from the fourth end surface 58b of the wavelength conversion rod 58 with each other. Subsequently, the composite light LW as white light consisting of the light L11 as the blue light and the second light L2 as the yellow light is emitted from the dichroic prism 55. As described above, by the partial light L11 out of the first light L1 and the second light L2 being combined with each other in the light combining section 53, the composite light LW as the white light is emitted from the light combining section 53.

The angle conversion element 56 is disposed on the light exit side of the light exit end surface 55c of the dichroic prism 55. The angle conversion element 56 is formed of a taper rod having a light incidence end surface 56a which the composite light LW enters, and a light exit end surface 56b from which the composite light LW is emitted. The angle conversion element 56 has a truncated quadrangular pyramid shape, and the cross-sectional area perpendicular to the optical axis J1 increases along the proceeding direction of the composite light LW, and the area of the light exit end surface 56b is larger than the area of the light incidence end surface 56a. Thus, the composite light LW changes the angle to the direction parallel to the optical axis J1 every time the composite light LW is totally reflected by the side surface 56c while proceeding inside the angle conversion element 56. In such a manner, the angle conversion element 56 makes the diffusion angle of the composite light LW in the light exit end surface 56b smaller than the diffusion angle of the composite light LW in the light incidence end surface 56a.

The angle conversion element 56 is fixed to the dichroic prism 55 so that the light incidence end surface 56a is opposed to the light exit end surface 55c of the dichroic prism 55. Specifically, the angle conversion element 56 and the dichroic prism 55 have contact with each other via an optical adhesive (not shown), and no air gap (no air layer) is disposed between the angle conversion element 56 and the dichroic prism 55. It should be noted that the angle conversion element 56 can also be fixed so as to have direct contact with the dichroic prism 55 by, for example, an arbitrary support member. In any case, it is desirable not to provide an air gap between the angle conversion element 56 and the dichroic prism 55. It is desirable to make the refractive index of the angle conversion element 56 and the refractive index of the dichroic prism 55 coincide with each other as precise as possible.

It should be noted that it is also possible to use a compound parabolic concentrator (CPC) as the angle conversion element 56 instead of the taper rod. When using the CPC as the angle conversion element 56, it is also possible to obtain substantially the same advantages as those when using the taper rod.

The collimator lens 57 is disposed on the light exit side of the light exit end surface 56b of the angle conversion element 56. The collimator lens 57 collimates the composite light LW emitted from the angle conversion element 56. Therefore, parallelism of the composite light LW the angle distribution of which is converted by the angle conversion element 56 is further improved by the collimator lens 57. The collimator lens 57 is formed of a convex lens. It should be noted that when sufficient parallelism is obtained by the angle conversion element 56 alone, it is not necessarily required to provide the collimator lens 57.

Hereinafter, an operation of the light source device 2 having the configuration described above will be described.

The light distribution of the LED light source 622 shows the Lambertian distribution. Therefore, the first light L1 to be emitted from the LED light source 622 has a sufficiently broad divergence angle.

Figure 3:
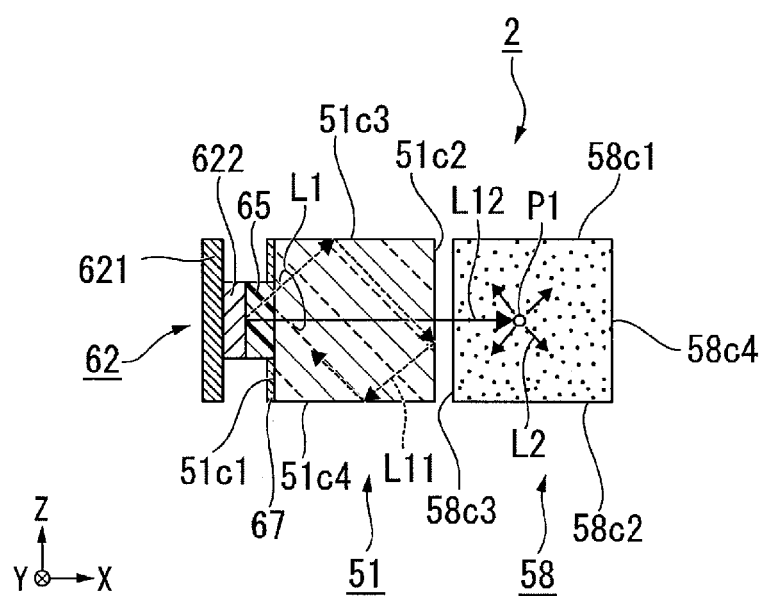
FIG. 3 is a cross-sectional view along the line III-III shown in FIG. 2.

As shown in FIG. 3, the first light L1 is emitted from the LED light source 622, then transmitted through the light transmissive member 65, and then enters the light guide rod 51 from the first side surface 51c1. The partial light L11 emitted at a large emission angle out of the first light L1 having entered the light guide rod 51 reaches any of the side surfaces at an incident angle no smaller than the critical angle. Such light L11 is reflected by the side surface, then propagates inside the light guide rod 51 to proceed toward the second end surface 51b while repeating the reflection by the side surface as shown in FIG. 2.

Subsequently, the light L11 which has been emitted from the second end surface 51b of the light guide rod 51, is reflected by the reflecting surface 54c of the prism 54, and thus, the light path of the light L11 is folded, and then the light L11 enters the dichroic prism 55. It should be noted that it is desirable that a gap (an air layer) is provided between the prism 54 and the dichroic prism 55 so that the prism 54 and the dichroic prism 55 do not have direct contact with each other. By providing the gap between the prism 54 and the dichroic prism 55, the light having entered the interface between the prism 54 and the dichroic prism 55 at the incident angle smaller than the critical angle out of the light L11 having proceeded to the vicinity of the interface can be prevented from being leaked outside the prism 54 or the dichroic prism 55, and thus, the light use efficiency can be improved.

In contrast, the light L12 having been emitted at a small emission angle out of the first light L1 having entered the light guide rod 51 reaches the second side surface 51c2 at an incident angle smaller than the critical angle. Such light L12 is emitted from the second side surface 51c2 of the light guide rod 51, and then, enters the wavelength conversion rod 58. On this occasion, the phosphor included in the wavelength conversion rod 58 is excited by the light L12, and the second light L2 is emitted from an arbitrary light emitting point P1. The second light L2 proceeds from the arbitrary light emitting point P1 toward all directions, but the second light L2 having proceeded toward each of the side surfaces 58c1, 58c2, 58c3, and 58c4 proceeds toward the third end surface 58a or the fourth end surface 58b while repeating the total reflection as shown in FIG. 2. The second light L2 having proceeded toward the fourth end surface 58b enters the dichroic prism 55 from the fourth end surface 58b. Meanwhile, the second light L2 having proceeded toward the third end surface 58a is reflected by the mirror 63, and then proceeds toward the fourth end surface 58b.

The light L11 having entered the dichroic prism 55 is reflected by the dichroic mirror 551. Meanwhile, the second light L2 having entered the dichroic prism 55 is transmitted through the dichroic mirror 551. As a result, the light L11 as the blue light and the second light L2 as the yellow light are combined with each other, and the composite light LW as the white light is emitted from the light exit end surface 55c of the dichroic prism 55. The composite light LW having been emitted from the dichroic prism 55 is collimated by the angle conversion element 56 and the collimator lens 57, and is then emitted from the light source device 2. The composite light LW (the illumination light WL) having been emitted from the light source device 2 proceeds toward the integrator optical system 31 as shown in FIG. 1.

In the light source device 2 according to the present embodiment, since the light guide rod 51 for emitting the light L11 as the blue light and the wavelength conversion rod 58 for emitting the second light L2 as the yellow light are opposed to each other on the second side surface 51c2 and the third side surface 58c3, the light combining section 53 is disposed on the second end surface 51b of the light guide rod 51 and the fourth end surface 58b of the wavelength conversion rod 58, and the light source section 62 is disposed so as to be opposed to the first side surface 51c1 of the light guide rod 51, it is possible to realize a light source device small in size and capable of emitting white light.

Since the light source device 2 according to the present embodiment has the configuration of guiding the light L11 as the blue light emitted from the light source section 62 to the light combining section 53 with the light guide rod 51, it is possible to efficiently obtain the blue light with a simple configuration without separately preparing the phosphor light source capable of emitting the blue light such as a combination of the ultraviolet LED and the blue phosphor.

As described above, since the LED light sources 622 show the Lambertian distribution, in particular when the diameter (the dimension B in a direction perpendicular to the longitudinal direction N1) of the light guide rod 51 is thin, it is difficult to make the first light L1 from the LED light sources 622 enter the end surface of the light guide rod 51. Therefore, when using the LED light sources 622, it is reasonable to adopt the configuration of making the first light L1 from the LED light sources 622 enter the side surface of the light guide rod 51 as in the present embodiment.

However, when making the first light L1 from the LED light sources 622 enter the side surface of the light guide rod 51, a part of the first light L1 enters, at an incident angle smaller than the critical angle, the side surface opposed to the side surface which the first light has entered, and is therefore emitted from the light guide rod 51 to the outside. As a result, the first light L1 having been emitted outside becomes a loss, and becomes a factor in decreasing the light use efficiency. According to the estimate by the inventors, it has been found out that when assuming the light distribution of the LED light source 622 as the Lambertian distribution, the light L11 corresponding to about 85% of the first light L1 having been emitted from the LED light source 622 and entered the light guide rod 51 propagates inside the light guide rod 51, and the light L12 corresponding to about 15% of the first light L1 is emitted outside from the light guide rod 51. In other words, about 15% of the first light L1 having entered the light guide rod 51 is the light not to be used.

To cope with this problem, in the light source device 2 according to the present embodiment, the light guide rod 51 and the wavelength conversion rod 58 are disposed so that the second side surface 51c2 and the third side surface 58c3 are opposed to each other, and the light source section 62 is disposed so as to be opposed to the first side surface 51c1 of the light guide rod 51. In other words, as shown in FIG. 3, the wavelength conversion rod 58 is disposed on the opposite side to the light source section 62 across the light guide rod 51. Therefore, the light L12 which is emitted from the second side surface 51c2 of the light guide rod 51, and is not used in the related art, enters the wavelength conversion rod 58, and makes a contribution as the excitation light for exciting the phosphor. As described above, according to the light source device 2 related to the present embodiment, it is possible to enhance the use efficiency of the first light L1 emitted from the light source section 62 compared to the related art.

Further, in the light source device 2 related to the present embodiment, since the light transmissive member 65 the same in refractive index as the light guide rod 51 intervenes between each of the LED light sources 622 and the light guide rod 51, the first light L1 having been emitted from the LED light sources 622 enters the light guide rod 51 via the light transmissive members 65. According to this configuration, it is possible to increase the light intensity of the first light L1 entering the light guide rod 51 compared to when the LED light sources 622 and the light guide rod 51 are disposed separately from each other, and the air intervenes therebetween.

Further, since the reflectance of the light exit surface of the LED light source 622 is not so high, the partial light L11 out of the first light L1 which propagates inside the rod while repeating the reflection on the side surfaces of the light guide rod 51 enters the LED light source 622 via the light transmissive member 65, and fails to be reflected by the light exit surface to become the loss to become the factor in decreasing the light use efficiency. In contrast, in the light source device 2 according to the present embodiment, the reflecting films 67 each formed of a dielectric multilayer film are disposed in the areas between the LED light sources 622 adjacent to each other in the first side surface 51c1 of the light guide rod 51. Thus, since the light loss caused when the light L11 propagating inside the light guide rod 51 is reflected by the first side surface 51c1 is suppressed, it is possible to improve the disadvantage caused by disposing the light transmissive members 65.

In the light source device 2 according to the present embodiment, since the angle conversion element 56 is disposed on the light exit side of the dichroic prism. 55, it is possible to collimate the composite light LW emitted from the dichroic prism 55. Further, since the collimator lens 57 is disposed on the light exit side of the angle conversion element 56, it is possible to further improve the parallelism of the composite light LW. Thus, it is possible to improve the light use efficiency in the optical system in the posterior stage of the light source device 2.

The projector 1 according to the present embodiment is equipped with the light source device 2 described above, and is therefore excellent in light use efficiency, and at the same time, reduction in size can be achieved.

Second Embodiment

Hereinafter, a second embodiment of the present disclosure will be described using FIG. 4.

A light source device according to the second embodiment is substantially the same in basic configuration as that of the first embodiment, but is different from that of the first embodiment in the point that an excitation light source section is added. Therefore, the description of the overall configuration of the light source device will be omitted.

Figure 4:
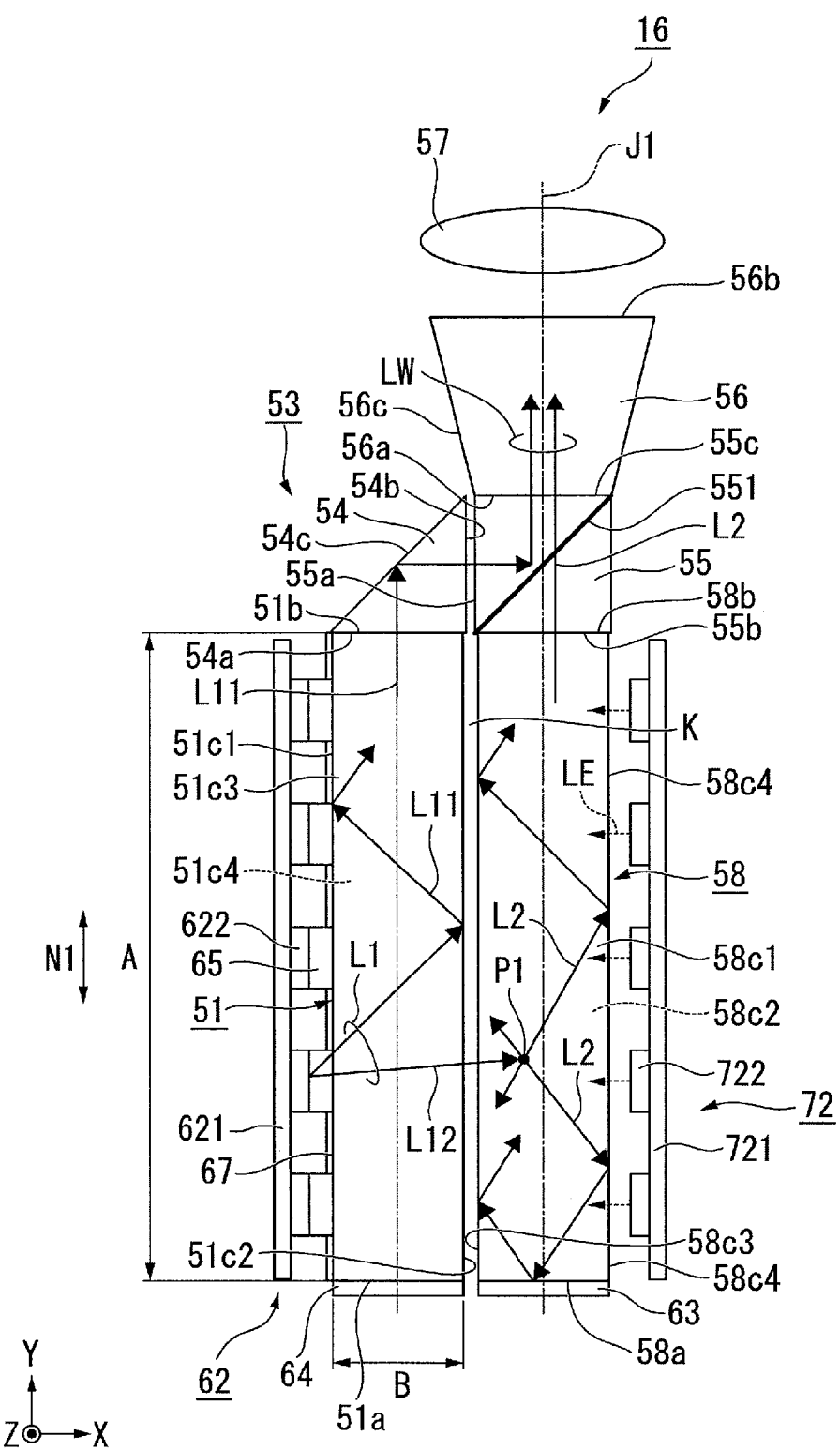
FIG. 4 is a plan view of a light source device according to a second embodiment.

FIG. 4 is a plan view showing a schematic configuration of a light source device 16 according to the second embodiment.

In FIG. 4, the constituents common to those shown in FIG. 2 are denoted by the same reference symbols, and the description thereof will be omitted.

As shown in FIG. 4, the light source device 16 is provided with the light guide rod 51 (the light guide body), the wavelength conversion rod 58 (the wavelength conversion section), the light source section 62, the excitation light source section 72, the light transmissive members 65, the light combining section 53, the angle conversion element 56, and the collimator lens 57.

The excitation light source section 72 is disposed so as to be opposed to the fourth side surface 58c4 of the wavelength conversion rod 58. The excitation light source section 72 is provided with a substrate 721 and a plurality of LED light sources 722 for emitting excitation light LE toward the wavelength conversion rod 58. The plurality of LED light sources 722 is mounted on one surface of the substrate 721 opposed to the fourth side surface 58c4 of the wavelength conversion rod 58. In the present embodiment, the excitation light source section 72 is provided with the five LED light sources 722, but the number of the LED light sources 722 is not particularly limited. The plurality of LED light sources 722 is arranged at intervals in the longitudinal direction N2 of the wavelength conversion rod 58. It should be noted that in the present embodiment, since the light source section 62 and the excitation light source section 72 respectively have the LED light sources 622, 722, the LED light sources 622 of the light source section 62 are referred to as first LED light sources 622, and the LED light sources 722 of the excitation light source section 72 are referred to as second LED light sources 722.

The wavelength band of the excitation light LE to be emitted from the second LED light sources 722 is a blue wavelength band of, for example, 400 nm through 480 nm, and the peak wavelength is, for example, 445 nm. In such a manner, the excitation light source section 72 emits the excitation light LE as the blue light toward the fourth side surface 58c4 of the wavelength conversion rod 58.

The partial light L11 out of the first light L1 having been emitted from the first LED light sources 622 of the light source section 62 propagates inside the light guide rod 51, and is then emitted from the light guide rod 51, and functions as the blue light constituting a part of the composite light LW. On the other hand, the excitation light LE having been emitted from the second LED light sources 722 of the excitation light source section 72 enters the wavelength conversion rod 58, and then functions as the excitation light for exciting the phosphor in the wavelength conversion rod 58. As described above, the function of the first light L1 emitted from the first LED light sources 622 and the function of the excitation light LE emitted from the second LED light sources 722 are different from each other. Therefore, it is possible for the first LED light sources 622 and the second LED light sources 722 to emit light with the respective wavelengths different from each other optimized as the blue light and the excitation light, respectively, or to emit light with the same wavelength used commonly to the both functions.

The rest of the configuration of the light source device 16 is substantially the same as in the first embodiment.

Also in the present embodiment, there can be obtained substantially the same advantage as in the first embodiment that it is possible to realize the light source device 16 small in size and high in efficiency.

Both of the first embodiment and the second embodiment have the configuration in which the other partial light L12 out of the first light L1 having been emitted from the light guide rod 51 enters the wavelength conversion rod 58. The light distribution of the first light L1 significantly affects the ratio between the amount of light L11 propagating inside the light guide rod 51 and the amount of the light L12 entering the wavelength conversion rod 58 in the first light L1 having been emitted from the light source section 62. In the configuration of the first embodiment, since it is difficult to control the light distribution of the first light L1, it is difficult to adjust the ratio between the light L11 and the light L12 in some cases. Therefore, when the proportion of the light L12 to the light L11 is insufficient, for example, the tint of the composite light LW becomes bluish white, and the composite light LW with the desired white color cannot be obtained in some cases.

In contrast, since the light source device 16 according to the present embodiment is provided with the excitation light source section 72, by adjusting the power to be supplied to the excitation light source section 72, it is possible to adjust the sum of the light intensity of the light L12 emitted from the light guide rod 51 to function as the excitation light and the light intensity of the excitation light LE from the excitation light source section 72 so as to be the optimum excitation light intensity. In such a manner, it is possible to adjust the white balance of the composite light LW to obtain the composite light LW with the desired white color. Further, from another viewpoint, in the case of the present embodiment, since all of the necessary excitation light is not covered by the excitation light LE from the excitation light source section 72, but the light L12 emitted from the light guide rod 51 is also used as the excitation light, it is possible to reduce the power consumption of the excitation light source section 72 compared to when the excitation light source section 72 covers all of the excitation light.

Third Embodiment

A third embodiment of the present disclosure will hereinafter be described using FIG. 5.

A light source device according to the third embodiment is substantially the same in basic configuration as that of the first embodiment, but is different in the numbers of the rods and the configuration of the light source section from that of the first embodiment. Therefore, the description of the overall configuration of the light source device will be omitted.

Figure 5:
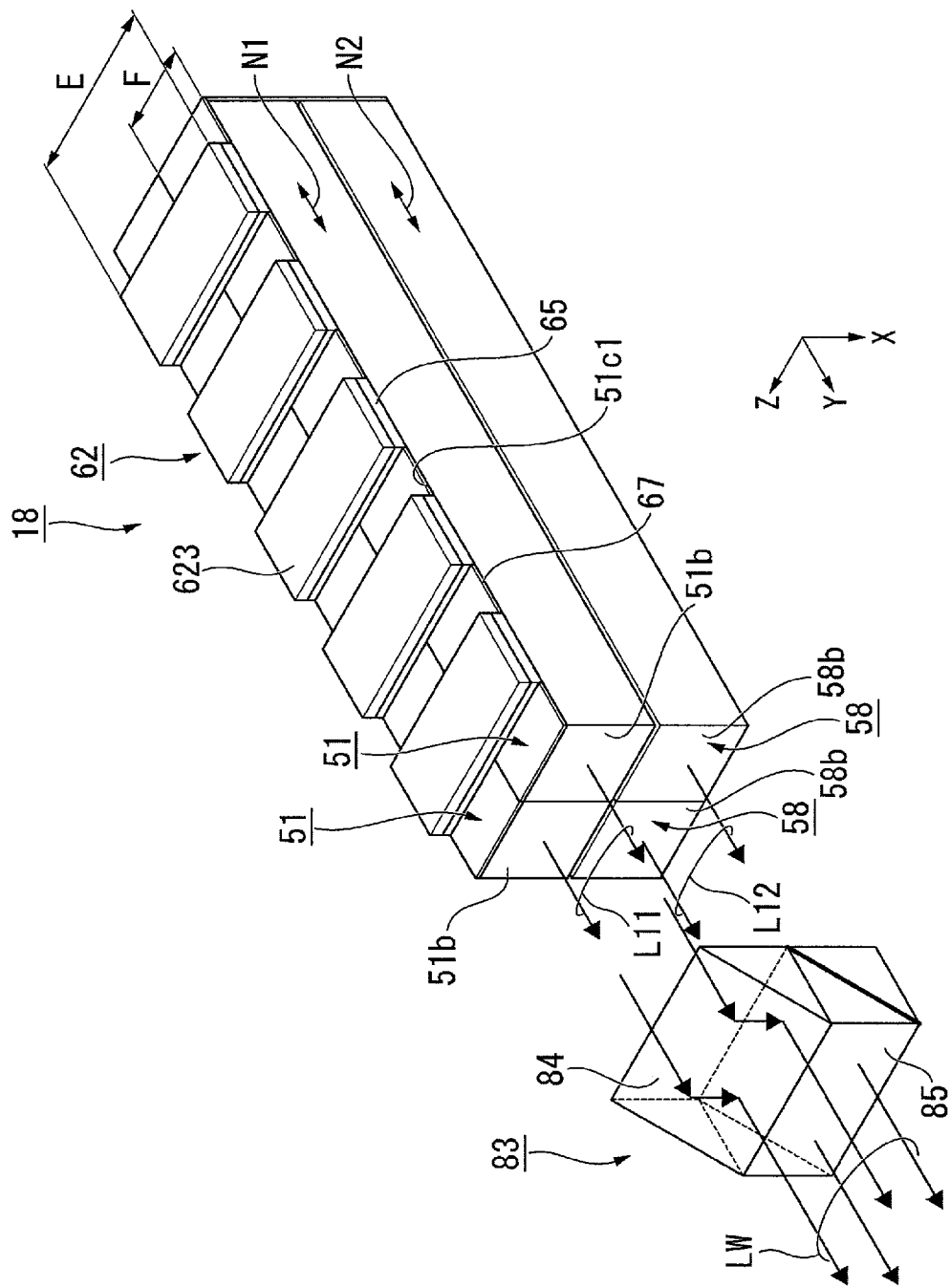
FIG. 5 is a perspective view of a light source device according to a third embodiment.

FIG. 5 is a plan view showing a schematic configuration of a light source device 18 according to the third embodiment.

In FIG. 5, the constituents common to those shown in FIG. 2 are denoted by the same reference symbols, and the description thereof will be omitted.

As shown in FIG. 5, the light source device 18 is provided with two light guide rods 51 (the light guide body), two wavelength conversion rods 58 (the wavelength conversion section), the light source section 62, the light transmissive members 65, a light combining section 83, the angle conversion element 56, and the collimator lens 57. It should be noted that in FIG. 5, in order to make the configuration of the light source section 62 eye-friendly, illustration of the substrate 621 of the light source section 62 is omitted. Further, in order to make the positional relationship between the rods eye-friendly, the light combining section 83 is illustrated so as to be separated from the rods. Further, the illustration of the angle conversion element 56 and the collimator lens 57 is omitted.

The two light guide rods 51 are arranged in parallel to each other in a direction (the Z-axis direction) perpendicular to a direction (the X-axis direction) in which the light guide rods 51 and the wavelength conversion rods 58 are arranged. The two light guide rods 51 are disposed with the side surfaces opposed to each other having contact with each other so that the longitudinal directions N1 of the respective light guide rods 51 become parallel to each other. It should be noted that the longitudinal directions N1 of the two light guide rods 51 are not necessarily required to be parallel to each other, but can also be tilted from the parallel state. Further, in the two light guide rods 51, the side surfaces opposed to each other can also be separated from each other.

Similarly to the light guide rods 51, the two wavelength conversion rods 58 are arranged in parallel to each other in a direction perpendicular to the direction in which the light guide rods 51 and the wavelength conversion rods 58 are arranged. The two wavelength conversion rods 58 are disposed with the side surfaces opposed to each other having contact with each other so that the longitudinal directions N2 of the respective wavelength conversion rods 58 become parallel to each other. It should be noted that the longitudinal directions N2 of the two wavelength conversion rods 58 are not necessarily required to be parallel to each other, but can also be tilted from the parallel state. Further, in the two wavelength conversion rods 58, the side surfaces opposed to each other can also be separated from each other.

The light source section 62 is provided with the substrate (not shown) and a plurality of LED light sources 623. The plurality of LED light sources 623 is arranged at intervals in the longitudinal direction N1 of the light guide rod 51. The LED light sources 623 are each disposed straddling the two light guide rods 51 so as to be opposed to the first side surfaces 51c1 of the respective two light guide rods 51. In the present embodiment, the light source section 62 is provided with the five LED light sources 623, but the number of the LED light sources 623 is not particularly limited.

The light combining section 83 is disposed at a position opposed to the second end surfaces 51b of the two light guide rods 51 and the fourth end surfaces 58*b* of the two wavelength conversion rods 58. The light combining section 83 is constituted by a prism 84 and a dichroic prism 85. The prism 84 is disposed straddling the two light guide rods 51 so as to be opposed to the second end surfaces 51*b* of the two light guide rods 51. The dichroic prism 85 is disposed straddling the two wavelength conversion rods 58 so as to be opposed to the fourth end surfaces 58*b* of the two wavelength conversion rods 58.

The rest of the configuration of the light source device 18 is substantially the same as in the first embodiment.

Also in the present embodiment, there can be obtained substantially the same advantage as in the first embodiment that it is possible to realize the light source device 18 small in size and high in efficiency.

The configuration of the present embodiment is effective when, for example, the dimension E of a side of the LED light source 623 is larger than the width F (the dimension in a direction perpendicular to the longitudinal direction N1) of the light guide rod 51. In other words, since the LED light sources 623 are disposed so as to straddle the two light guide rods 51, it is possible to achieve a configuration in which the LED light sources 623 do not protrude from the light guide rods 51. Thus, it is possible to make the first light emitted from the LED light sources 623 efficiently enter the light guide rods 51. Further, by sharing the one LED light source 623 with the two light guide rods 51, it is possible to make the etendue of the light source device 18 smaller.

Modified Example

It is also possible for the light source device 18 according to the third embodiment to have a configuration described below.

Figure 6:
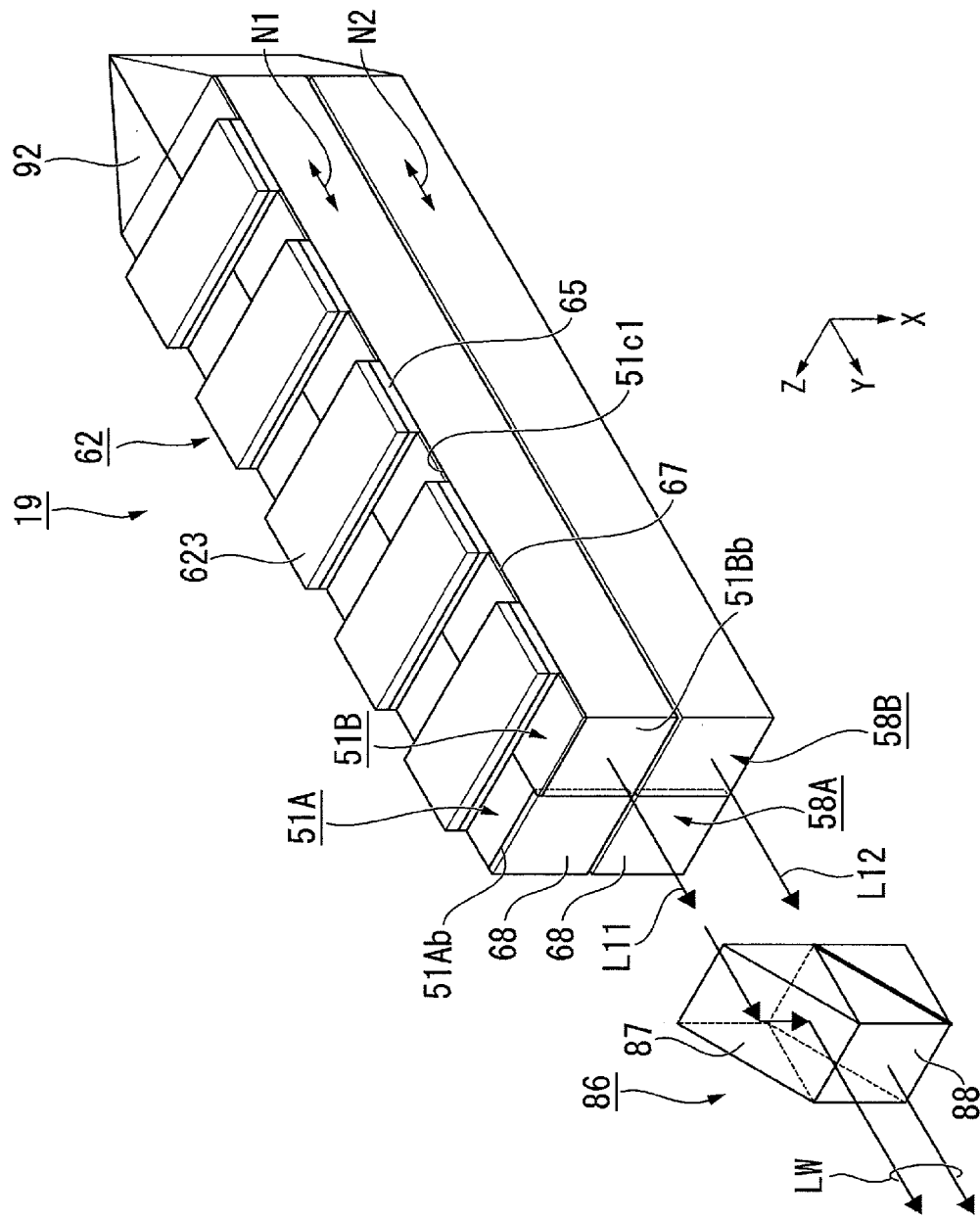
FIG. 6 is a perspective view of a light source device according to a modified example of the third embodiment.
Figure 7:
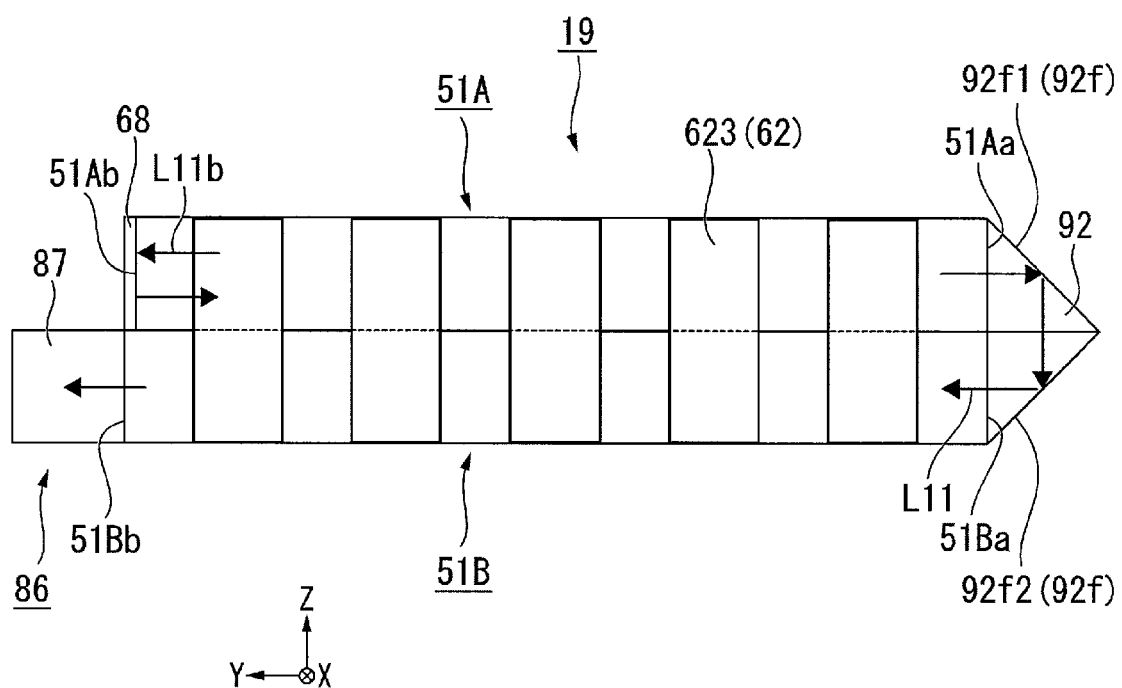
FIG. 7 is a plan view of the light source device according to the modified example.

FIG. 6 is a perspective view of a light source device 19 according to the modified example. FIG. 7 is a plan view of the light source device 19 viewed from light guide rods 51A, 51B side. In FIG. 6 and FIG. 7, the constituents common to those shown in FIG. 5 are denoted by the same reference symbols, and the description thereof will be omitted.

As shown in FIG. 6 and FIG. 7, the light source device 19 is provided with the two light guide rods 51A, 51B (the light guide body), two wavelength conversion rods 58A, 58B (the wavelength conversion section), the light source section 62, the light transmissive members 65, a light combining section 86, the angle conversion element 56, the collimator lens 57, and a prism mirror 92. In FIG. 6 and FIG. 7, in order to make the drawings eye-friendly, the illustration of the substrate 621 of the light source section 62, the angle conversion element 56, and the collimator lens 57 is omitted. Further, in order to make the positional relationship between the rods eye-friendly, the light combining section 86 is illustrated so as to be separated from the rods in FIG. 6.

As shown in FIG. 7, the prism mirror 92 has a reflecting surface 92*f* disposed so as to be opposed to a first end surface 51Aa of the light guide rod 51A and a first end surface 51Ba of the light guide rod 51B. It should be noted that although not shown in FIG. 7, the reflecting surface 92*f* is also opposed to the first end surfaces (not shown) of the two wavelength conversion rods 58A, 58B. The prism mirror 55 is formed of a prism shaped like a triangular prism having an isosceles right triangular cross-sectional shape. The reflecting surface 92*f* has a first reflecting surface 92*f*1 and a second reflecting surface 92*f*2. The first reflecting surface 92*f*1 is opposed to the first end surface 51Aa of the light guide rod 51A, and the second reflecting surface 92*f*2 is opposed to the first end surface 51Ba of the light guide rod 51B.

The prism mirror 92 has a function of folding the light path of the light L11 having entered the prism mirror 92 at an angle of 180°, and then emitting the light L11. Specifically, the prism mirror 92 sequentially reflects the light L11 having entered the prism mirror 92 with the two reflecting surfaces 92*f*1, 92*f*2 to thereby emit the light L11 with the light path folded as much as 180°. Thus, the light L11 having been emitted from the light guide rod 51A is guided by the prism mirror 92 to the light guide rod 51B. Further, although not shown in FIG. 7, the prism mirror 92 has a function of guiding the light L12 generated in the wavelength conversion rod 58A to the wavelength conversion rod 58B similarly to the light L11.

The light combining section 86 is constituted by a prism 87 and a dichroic prism 88. The light combining section 86 is disposed so as to be opposed only to the light guide rod 51B and the wavelength conversion rod 51B as one of the two light guide rods 51A, 51B and the two wavelength conversion rods 58A, 58B. Therefore, the width (the dimension in the Z-axis direction) of the light combining section 86 is substantially a half of the width (the dimension in the Z-axis direction) of the light combining section 83 in the third embodiment (FIG. 5).

Further, on the second end surface 51Ab of the light guide rod 51A and the second end surface of the wavelength conversion rod 58A on the side to which the light combining section 86 is not opposed, there are respectively disposed the mirrors 68. Therefore, as shown in FIG. 7, light L11*b* proceeding toward the second end surface 51Ab out of the light L11 propagating inside the light guide rod 51A is reflected by the mirror 68, and proceeds toward the first end surface 51Aa. The light L12 propagating inside the wavelength conversion rods 58A, 58B shows substantially the same behavior.

Also in the present modified example, there can be obtained substantially the same advantage as in the first embodiment that it is possible to realize the light source device 19 small in size and high in efficiency.

Further, in the case of the present modified example, as described above, the light L11 and the light L12 having propagated through the light guide rod 51A as one of the light guide rods and the wavelength conversion rod 58A as one of the wavelength conversion rods are reflected to be guided to the light guide rod 51B as the other of the light guide rods and the wavelength conversion rod 58B as the other of the wavelength conversion rods using the prism mirror 92, and are then emitted from the light guide rod 51B and the wavelength conversion rod 58B, respectively. According to this configuration, the beam width (the dimension in the Z-axis direction) of the composite light LW by the present modified example becomes substantially a half of the beam width (the dimension in the Z-axis direction) of the composite light LW by the third embodiment although the point that the two light guide rods 51A, 51B and the two wavelength conversion rods 58A, 58B are used is common to the present modified example and the third embodiment. As described above, according to the present modified example, it is possible to reduce the size of the light source image compared to the third embodiment, and it is possible to achieve reduction in etendue.

Fourth Embodiment

A fourth embodiment of the present disclosure will hereinafter be described using FIG. 8.

There is cited the example of the liquid crystal projector in the first embodiment, but in the fourth embodiment, the description will be presented citing an example of a projector equipped with a micromirror type light modulation device.

Figure 8:
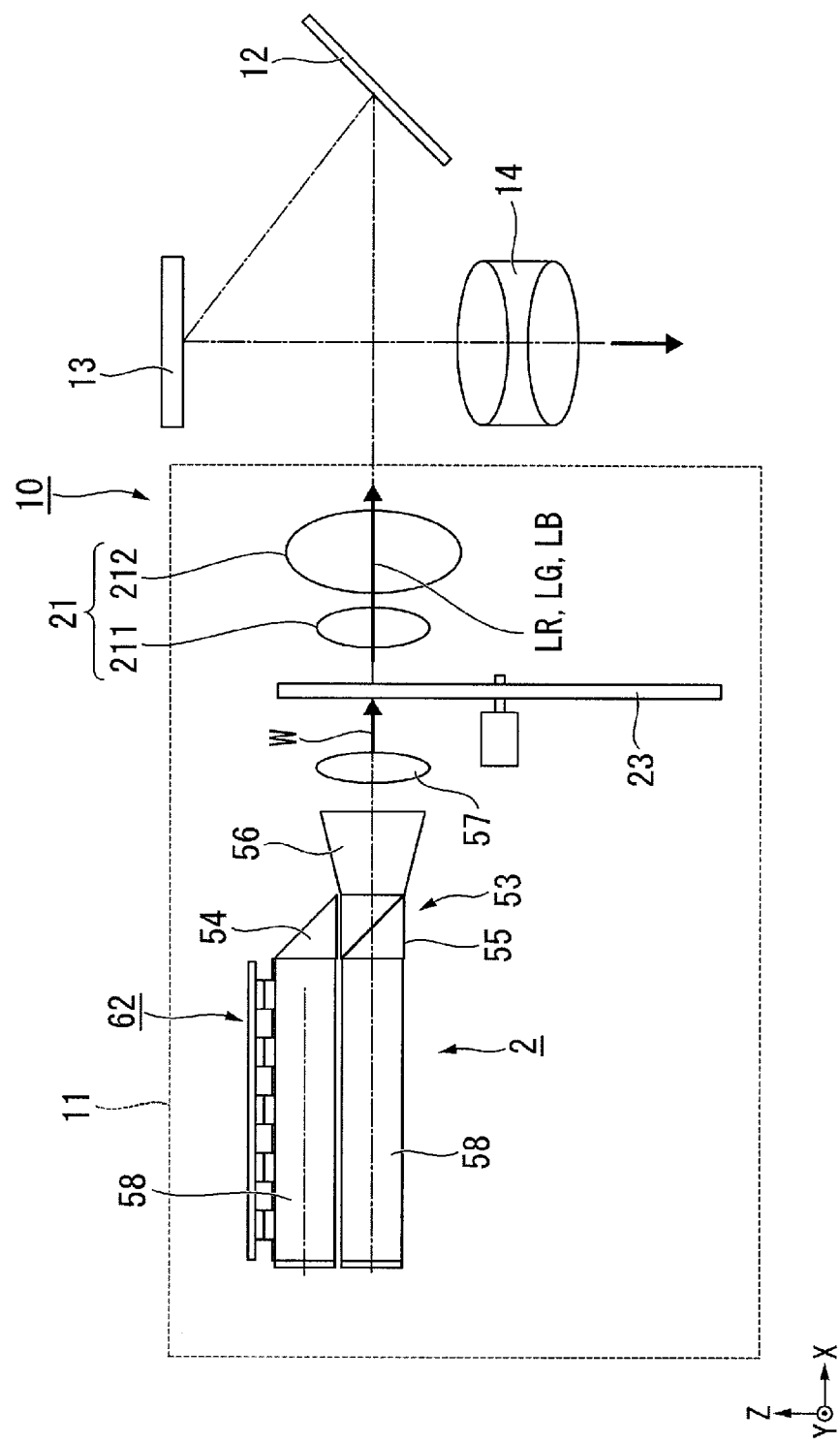
FIG. 8 is a schematic configuration diagram of a projector according to a fourth embodiment.

As shown in FIG. 8, a projector 10 according to the fourth embodiment is provided with an illumination device 11, a light guide optical system 12, a micromirror type light modulation device 13 and a projection optical device 14. The illumination device 11 is provided with the light source device 2, a color wheel 23 and a pickup optical system 21.

In the fourth embodiment, the light source device 2 according to the first embodiment is used as the light source device. It should be noted that it is also possible to use the light source device 16 according to the second embodiment or the light source device 18 according to the third embodiment instead of the light source device 2. Therefore, in the fourth embodiment, the description of the light source device 2 will be omitted.

The color wheel 23 has a configuration in which color filters corresponding respectively to three colors of red, green and blue are disposed on a rotatable substrate along the circumferential direction of a rotary shaft. By the composite light LW as white light emitted from the light source device 2 passing through the color wheel 23 rotating at high speed, the red light LR, the green light LG, and the blue light LB are emitted from the color wheel 23 in a time-sharing manner.

The pickup optical system 21 is constituted by a first lens 211 and a second lens 212. The first lens 211 and the second lens 212 are each formed of a convex lens. The red light LR, the green light LG, and the blue light LB emitted from the color wheel 23 are transmitted to the light guide optical system 12 by the pickup optical system 21.

The light guide optical system 12 is formed of a reflecting mirror. The light guide optical system. 12 reflects the red light LR, the green light LG, and the blue light LB emitted from the light source device 2 to make the red light LR, the green light LG, and the blue light LB enter the light modulation device 13 in a time-sharing manner.

As the micromirror type light modulation device 13, there is used, for example, a Digital Micromirror Device (DMD). The DMD has a configuration having a plurality of micromirrors arranged in a matrix. The DMD switches the tilt directions of the plurality of micromirrors to thereby switch the reflection direction of the incident light at high speed between the direction in which the incident light enters the projection optical device 14 and the direction in which the incident light fails to enter the projection optical device 14. As described above, the light modulation device 13 sequentially modulates the red light LR, the green light LG, and the blue light LB having been emitted from the light source device 2 to generate a red image, a green image, and a blue image.

The projection optical device 14 projects the red image, the green image and the blue image on a screen. The projection optical device 14 is constituted by, for example, a plurality of projection lenses.

The projector 10 according to the present embodiment is equipped with the light source device 2 according to the first embodiment, and is therefore excellent in light use efficiency, and at the same time, reduction in size can be achieved.

It should be noted that the scope of the present disclosure is not limited to the embodiments described above, but a variety of modifications can be provided thereto within the scope or the spirit of the present disclosure.

For example, there is cited the example in which the wavelength conversion rod includes the phosphor for emitting the yellow fluorescence in the first embodiment described above, it is also possible for the wavelength conversion rod to include two types of phosphor consisting of the phosphor for emitting the green fluorescence and the phosphor for emitting the red fluorescence. In that case, it is possible for the two types of phosphor to be homogenously mixed inside the wavelength conversion rod, or to be eccentrically located in separate areas.

Although in the embodiments described above, there is cited the example of the light source device for emitting the white light, the present disclosure can also be applied to a light source device for emitting other colored light than the white light. For example, it is also possible to configure a light source device which is provided with the light guide rod for emitting the blue light and a wavelength conversion rod for emitting the red light, and which emits magenta light generated by combining the blue light and the red light with each other. Even in that case, according to the present disclosure, it is possible to realize the light source device small in size and high in efficiency for emitting the magenta light. Further, it is also possible to configure a light source device for emitting the white light using this light source device and a light source device for emitting the green light.

Although in the embodiments described above, there is presented the configuration example using the prism and the dichroic prism as the light combining element, it is also possible to apply other optical members capable of performing light composition. For example, it is also possible to use a reflecting mirror instead of the prism. Further, it is also possible to use a scattering body having a light-scattering structure inside instead of the dichroic prism. As an example of the scattering body, there can be cited glass including scattering particles, an optical member including an anisotropic scattering layer, and so on. When the scattering body is used, it is possible to perform the light composition by scattering a part of the blue light and a part of the yellow light in the same direction although the light use efficiency decreases in some degree.

Further, the specific configurations such as the shape, the number, the arrangement, and the material of each of the constituents constituting the light source device are not limited to those of the embodiments described above, but can arbitrarily be modified.

Although in the first embodiment described above, there is described an example when applying the present disclosure to the transmissive liquid crystal projector, the present disclosure can also be applied to a reflective liquid crystal projector. Here, "transmissive" means that the liquid crystal light valve including the liquid crystal panel and so on has a configuration of transmitting the light. The term "reflective" means that the liquid crystal light valve has a configuration of reflecting the light.

Although in the first embodiment described above, there is cited the example of the projector using three liquid crystal panels, the present disclosure can also be applied to a projector using one liquid crystal light valve alone or a projector using four or more liquid crystal light valves.

Although in the embodiments described above, there is described the example of installing the light source device according to the present disclosure in the projector, this is not a limitation. The light source device according to the present disclosure can also be applied to lighting equipment, a headlight of a vehicle, and so on.

What is claimed is:

1. A light source device comprising:
a light source section configured to emit first light;
a light guide body configured to propagate a part of the first light emitted from the light source section;
a wavelength conversion section including a phosphor which is excited by another part of the first light emitted from the light source section and transmitted though the light guide body, and emits second light; and
a light combining section configured to combine the part of the first light emitted from the light guide body and the second light emitted from the wavelength conversion section with each other, wherein
the light guide body has a first side surface and a second side surface opposed to each other, and a first end surface and a second end surface opposed to each other,
the wavelength conversion section has a third side surface and a fourth side surface opposed to each other, and a third end surface and a fourth end surface opposed to each other,
the light source section is disposed at a position opposed to the first side surface, and
the light guide body and the wavelength conversion section are disposed in parallel to each other so that the second side surface and the third side surface are opposed to each other.

2. The light source device according to claim 1, wherein the light guide body and the wavelength conversion section are disposed adjacent to each other so that a longitudinal direction of the light guide body and a longitudinal direction of the wavelength conversion section are parallel to each other.

3. The light source device according to claim 1, wherein the first light is blue light, and the second light is yellow light, and
the light combining section combines the part of the first light and the second light with each other to thereby emit white light.

4. The light source device according to claim 1, further comprising:
a light transmissive member disposed between the light source section and the first side surface.

5. The light source device according to claim 4, wherein a refractive index of the light transmissive member and a refractive index of the light guide body are equal to each other.

6. The light source device according to claim 1, further comprising:
an excitation light source section disposed so as to be opposed to the fourth side surface, and configured to emit excitation light toward the wavelength conversion section.

7. The light source device according to claim 1, wherein the light source section includes a light emitting diode light source.

8. The light source device according to claim 7, wherein the light source section includes a plurality of light emitting diode light sources, and
the light emitting diode light sources are arranged at intervals.

9. The light source device according to claim 8, wherein the light guide body includes a reflecting film disposed in an area between the light emitting diode light sources adjacent to each other on the first side surface.

10. The light source device according to claim 1, wherein the light combining section is disposed at a position opposed to the second end surface and the fourth end surface.

11. The light source device according to claim 10, wherein the light combining section includes a prism opposed to the second end surface, and a dichroic prism opposed to the fourth end surface.

12. A projector comprising:
the light source device according to claim 1;
a light modulation device configured to modulate light from the light source device in accordance with image information; and
a projection optical device configured to project the light modulated by the light modulation device.

* * * * *